US008026762B2

(12) United States Patent  
Honcharenko (10) Patent No.: US 8,026,762 B2  
(45) Date of Patent: Sep. 27, 2011

(54) HIGH EFFICIENCY TRANSMITTER FOR WIRELESS COMMUNICATION

(75) Inventor: Walter Honcharenko, Monmouth Junction, NJ (US)

(73) Assignee: Alcatel Lucent, Paris (FR)

( * ) Notice: Subject to any disclaimer, the term of this patent is extended or adjusted under 35 U.S.C. 154(b) by 0 days.

(21) Appl. No.: 12/487,206

(22) Filed: Jun. 18, 2009

(65) Prior Publication Data

US 2010/0321107 A1 Dec. 23, 2010

(51) Int. Cl.  
*H03F 3/68* (2006.01)

(52) U.S. Cl. .................................. 330/124 R; 330/149

(58) Field of Classification Search .................. 330/149, 330/124 R, 84; 455/114.3; 375/296–297  
See application file for complete search history.

(56) References Cited

U.S. PATENT DOCUMENTS

| | | | | |
|---|---|---|---|---|
| 6,054,896 A | * | 4/2000 | Wright et al. ................. | 330/149 |
| 6,633,200 B2 | * | 10/2003 | Kolanek ........................ | 330/149 |
| 7,737,778 B2 | * | 6/2010 | Saed ............................. | 330/149 |
| 2006/0153147 A1 | | 7/2006 | Chillariga et al. ............ | 370/337 |
| 2007/0280175 A1 | | 12/2007 | Cheng et al. ................... | 370/338 |
| 2010/0105338 A1 | * | 4/2010 | Wang et al. ..................... | 455/73 |

OTHER PUBLICATIONS

International Search Report PCT/US2010/036801 dated Sep. 17, 2010.  
Written Opinion dated Dec. 17, 2010.

* cited by examiner

*Primary Examiner* — Hieu Nguyen  
(74) *Attorney, Agent, or Firm* — Williams, Morgan & Amerson, PC (57) ABSTRACT

The present invention provides an amplifier for a wireless transmitter. In one embodiment, the amplifier includes a signal separator for decomposing an input signal into constant envelope signals and amplifier circuits for amplifying the constant envelope signals. The amplifier also includes a combiner for combining the amplified constant envelope signals to form an output signal that is an amplified representation of the input signal. Linear correction circuits are used to apply gain, phase, and/or delay correction to the constant envelope signals. The corrections are determined based upon a feedback portion of the output signal. Pre-distortion circuits are used to apply a non-linear pre-distortion to the constant envelope signals. The non-linear pre-distortion is determined based upon the feedback portion of the output signal.

12 Claims, 9 Drawing Sheets

HIGH EFFICIENCY TRANSMITTER FOR WIRELESS COMMUNICATION

BACKGROUND OF THE INVENTION

1. Field of the Invention

This invention relates generally to communication systems, and, more particularly, to wireless communication systems.

2. Description of the Related Art

Power consumption and power conversion by wireless communication transmitters have historically been poor. Linear amplifiers used in wireless communication networks were only a few percent efficient in the early 90's. More recently, wireless transmitters have implemented "less linear" amplifiers that use digital linearization techniques to achieve efficiencies in the 30-40% range. However, even these efficiencies are now thought to be insufficient. For example, service providers and world governments have increased pressure to decrease energy consumption and have set a target efficiency of more than 40% for future wireless transmitters. Achieving this goal would represent a revolutionary leap in efficiency for wireless transmitters, particularly in, but not limited to, the area of mobile telephony. One technique that could, in theory, achieve the target efficiencies is the so-called LINC transmitter/amplifier approach (LINC: LInear Amplification using Non linear Components).

The concept of LINC amplifiers and Chireix combiners was proposed in 1935 by H. Chireix. Analog circuits were used to construct the first implementations of a LINC amplifier. Although the theoretical foundations for the required signal processing are sound, real-world implementation of the mathematics of Chireix signal processing proved difficult and analog LINC amplifiers have to date failed to achieve the theoretical efficiencies. Using recent advantages in digital signal processing hardware, it is possible to apply the LINC methods to communication signals that conform to air interface standards such as CDMA, UMTS, LTE, OFDM, and combinations thereof. However, attempts to construct commercial implementations of a LINC amplifier for a wireless transmitter have also failed to achieve the theoretical maximum efficiencies. The failure of both the analog and digital approaches to achieve the theoretical efficiencies results, at least in part, from numerous path impairments in LINC systems. The impairments include, but are not limited to, group delay, gain, phase, flatness, and phase loading/pulling of the time varying load. Filtering has typically been used to reduce spurious emissions and current architectures rely on wideband filtering, which can reduce filter insertion losses in some cases.

Figure 1:
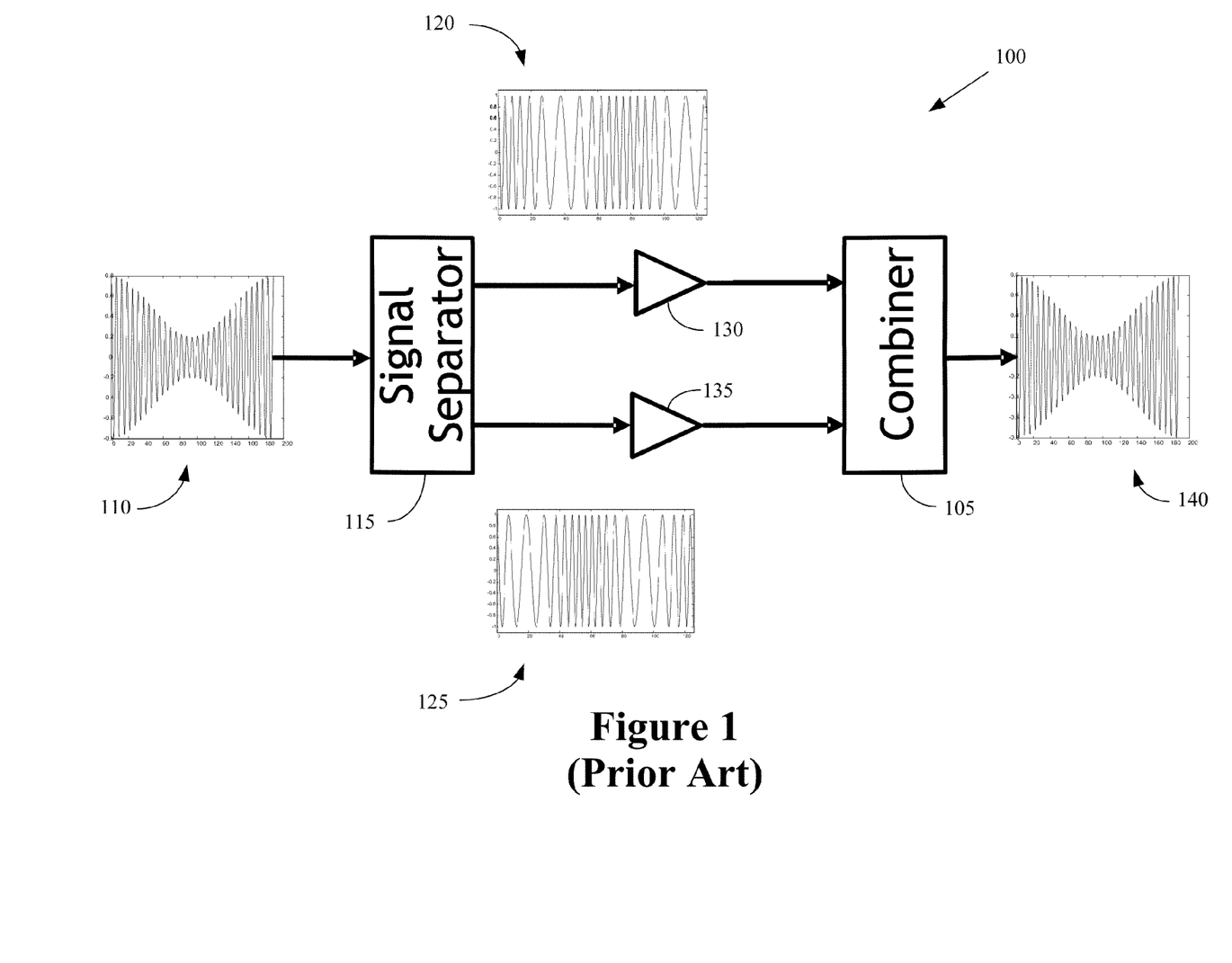
FIG. 1 conceptually illustrates a conventional LINC amplifier with a Chireix combiner.

FIG. 1 conceptually illustrates a conventional LINC amplifier 100 with a combiner 105 such as a Chireix combiner. An input signal 110 is provided to the amplifier 100, which includes a signal separator 115 that decomposes the input signal 110 into two constant envelope signals 120, 125. Each branch of the amplifier 100 includes a non-linear amplifying circuit 130, 135 that is used to amplify the corresponding constant envelope signals 120, 125. The amplified signals 120, 125 are then provided to the combiner 105, which combines the signals to form an amplified signal 140. In theory, the constant envelope signals 120, 125 are amplified by exactly the same gain and propagate through the two branches of the amplifier 120 with exactly the same delays and phase shifts. Consequently, when the constant envelope signals 120, 125 are combined at the combiner 105, they form an amplified signal 140 that is an exact amplified replica of the input signal 110. However, in practice each element in the LINC amplifier 100 introduces slightly different gains, delays, and/or phase shifts, which can significantly degrade the quality of the amplified signal 140.

Figure 2A:
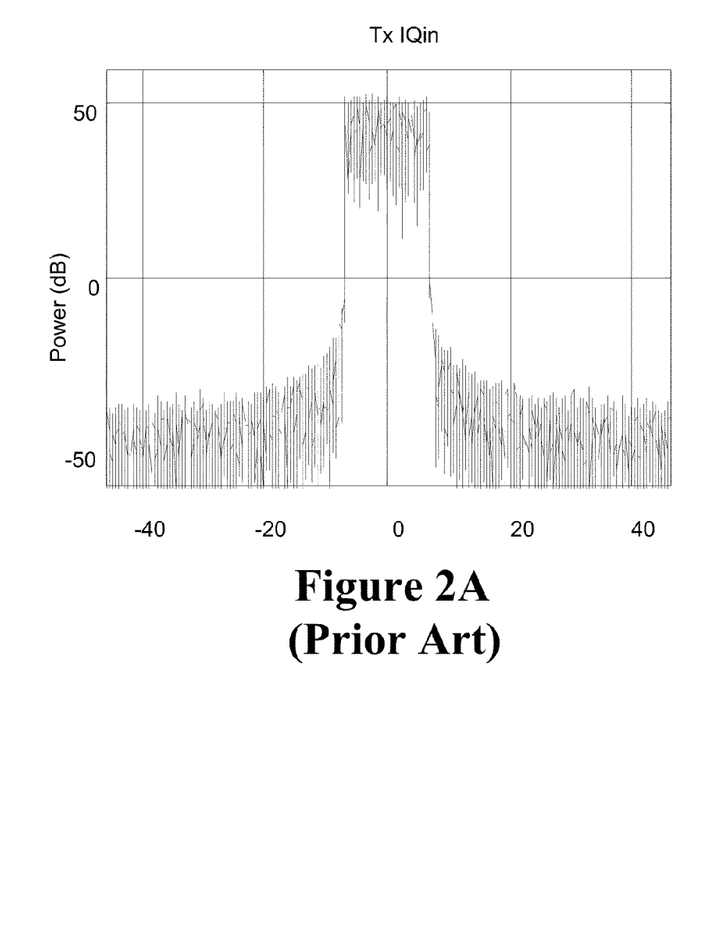
FIGS. 2A and 2B show simulation results that illustrate the degradation in the reconstructed signal caused by a gain imbalance between two paths in a LINC amplifier.
Figure 2B:
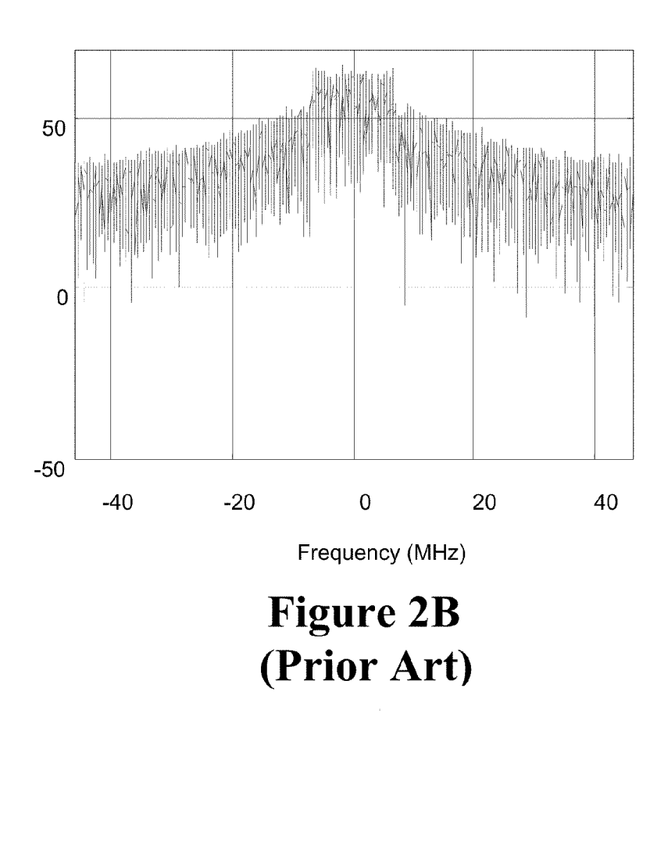

FIGS. 2A and 2B show simulation results that illustrate the degradation in the reconstructed signal caused by a gain imbalance between two paths in a LINC amplifier. The vertical axis is in decibels and the horizontal axis is in megahertz. In the simulation shown in FIGS. 2A and 2B, the input signal represents a signal that is transmitted in a bandwidth of approximately 20 MHz that is centered in the figure. The wings of the signal represent noise outside of the transmission bandwidth. The noise level of the simulated input signal is approximately 80 dB below the signal in the transmission bandwidth, as shown in FIG. 2A. The simulation assumes a gain imbalance of 0.1 dB between the two paths of the LINC amplifier. In that case, the reconstructed signal shown in FIG. 2B has a noise floor that is only approximately 10 to 30 dB below the signal in the transmission bandwidth. Thus, the relatively small gain imbalance of 0.1 dB significantly degrades the quality of the reconstructed amplified signal.

SUMMARY OF THE INVENTION

The disclosed subject matter is directed to addressing the effects of one or more of the problems set forth above. The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

In one embodiment, a LINC amplifier is provided. The amplifier may include a signal separator for decomposing an input signal into constant envelope signals and amplifier circuits for amplifying the constant envelope signals. The amplifier may also include a combiner for combining the amplified constant envelope signals to form an output signal that is an amplified representation of the input signal. Linear correction circuits can be used to apply gain, phase, and/or delay correction to the constant envelope signals. The corrections are determined based upon a feedback portion of the output signal. Pre-distortion circuits can be used to apply a non-linear pre-distortion to the constant envelope signals. The non-linear pre-distortion is determined based upon the feedback portion of the output signal.

BRIEF DESCRIPTION OF THE DRAWINGS

The disclosed subject matter may be understood by reference to the following description taken in conjunction with the accompanying drawings, in which like reference numerals identify like elements, and in which.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the scope of the appended claims.

DETAILED DESCRIPTION OF SPECIFIC EMBODIMENTS

Illustrative embodiments are described below. In the interest of clarity, not all features of an actual implementation are described in this specification. It will of course be appreciated that in the development of any such actual embodiment, numerous implementation-specific decisions may be made to achieve the developers' specific goals, such as compliance with system-related and business-related constraints, which may vary from one implementation to another. Moreover, it will be appreciated that such a development effort might be complex and time-consuming, but would nevertheless be a routine undertaking for those of ordinary skill in the art having the benefit of this disclosure.

The disclosed subject matter will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Figure 3:
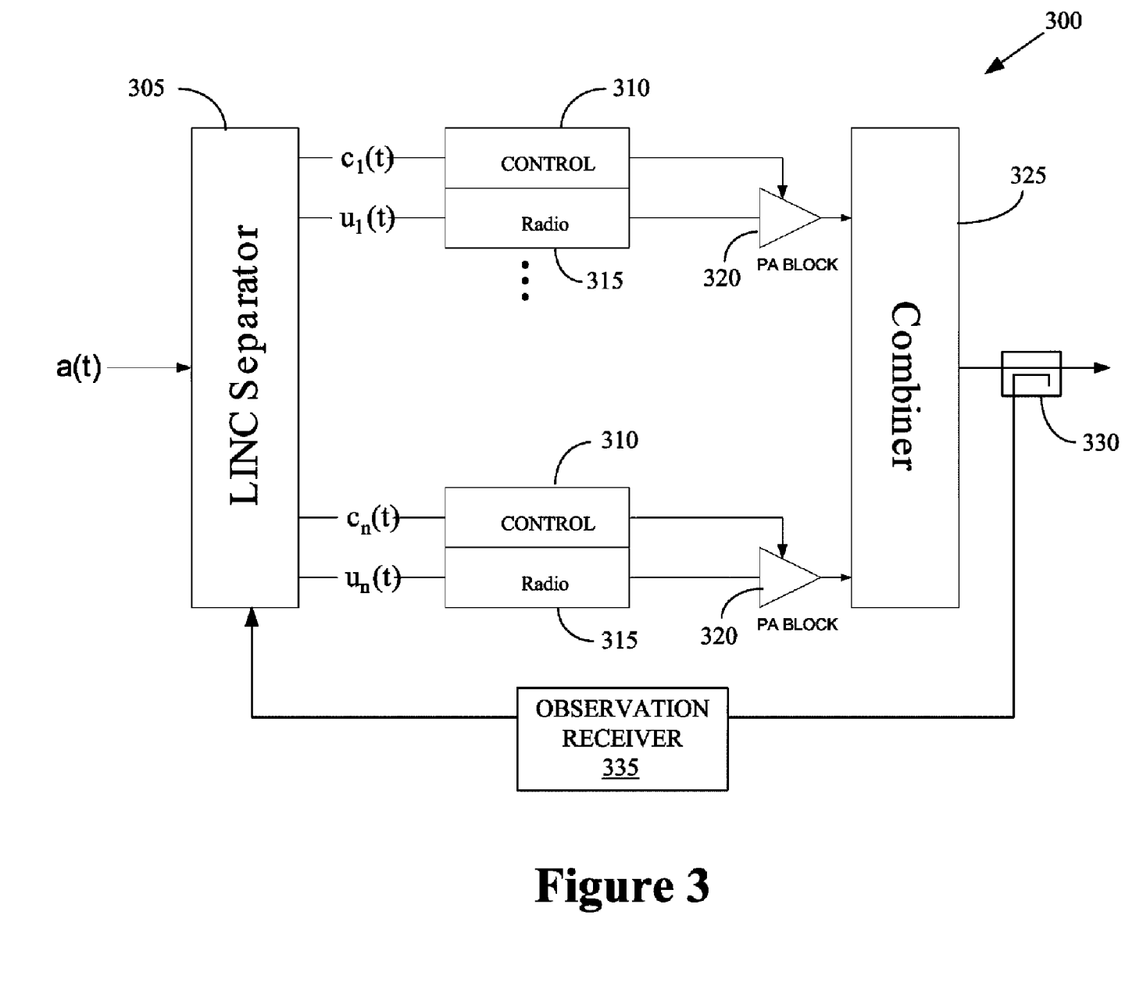
FIG. 3 conceptually illustrates one exemplary embodiment of a LINC amplifier.

FIG. 3 conceptually illustrates one exemplary embodiment of a LINC amplifier 300. In the illustrated embodiment, the LINC amplifier 300 includes a LINC separator 305 that receives an input signal, a(t), which is a bounded amplitude and phase modulated signal. The separator 305 is configured to divide the input signal into two or more constant envelope phase modulated signals, $u_{1-n}(t)$, which can be added to recreate the bounded amplitude-modulated input signal.

Figure 4:
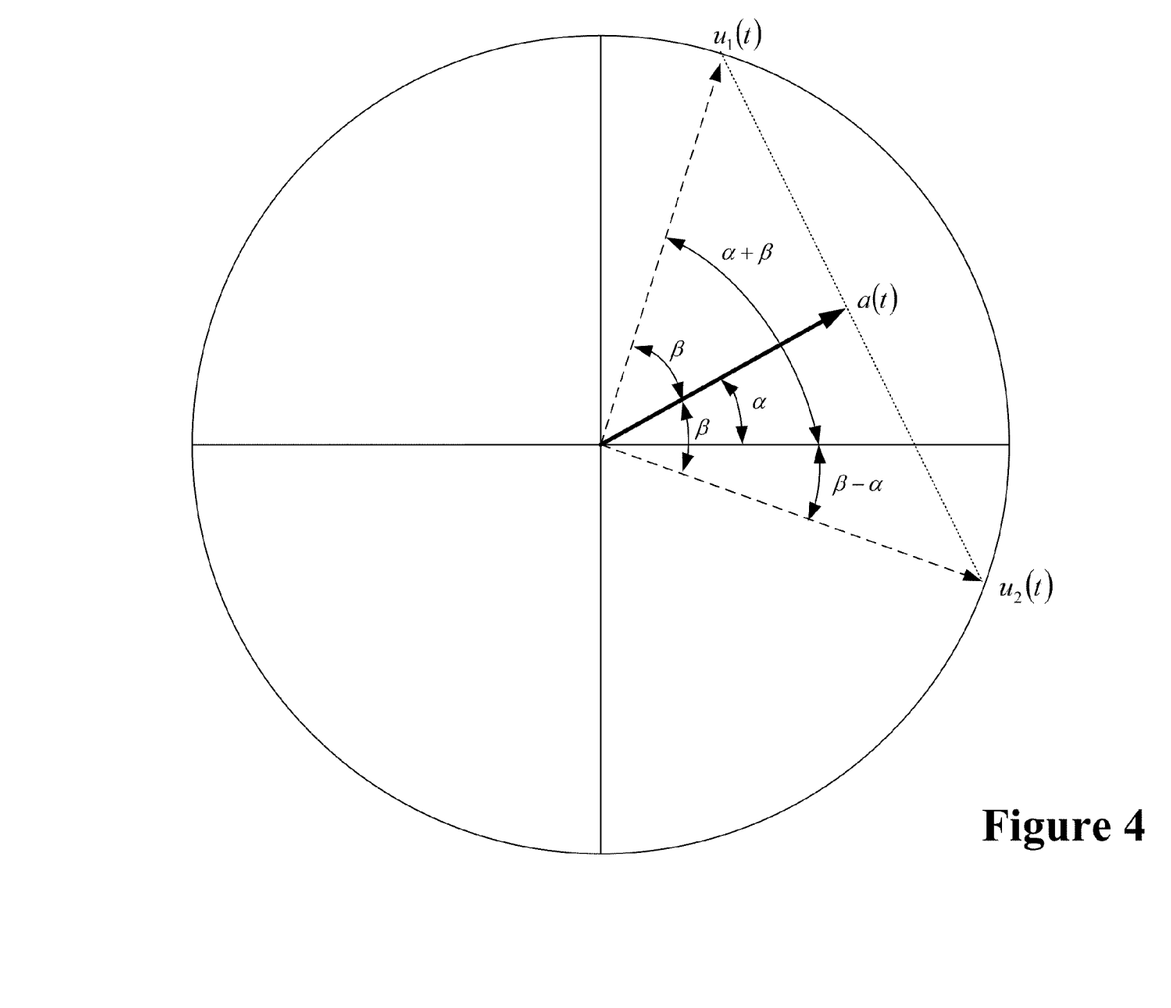
FIG. 4 conceptually illustrates one exemplary embodiment of a decomposition of the input bounded amplitude modulated signal into two constant envelope phase modulated signals.

FIG. 4 conceptually illustrates one exemplary embodiment of a decomposition of the input bounded amplitude modulated signal, a(t), into two constant envelope phase modulated signals, $u_{1-2}(t)$. In the illustrated embodiment, the modulated signal is represented as $$a(t) \cdot \cos(\omega t + \theta) = \left(\frac{A_{max}}{2}\right)\cos(\omega t + \theta + \phi) + \left(\frac{A_{max}}{2}\right)\cos(\omega t + \theta - \phi)$$

The angle and maximum amplitude are defined as $$\phi = \cos^{-1}\left(\frac{a(t)}{A_{max}}\right)$$

and $$A_{max} = \max|a(t)|$$

Using the unit circle shown in FIG. 4, let be an angle defined so that $\cos \beta = r/2$, where $r = a(t)/A_{max}$. Applying Euler's identity $\cos \beta = (e^{j\beta} + e^{-j\beta})/2$ to the vectors shown in FIG. 4, one can define:

$$u = u_1 + u_2 = x + jy = re^{j\alpha} = e^{j(\alpha+\beta)} + e^{j(\alpha-\beta)}.$$

The digital signal separation function will compute two complex exponentials: $u_1(t) = e^{j(\alpha+\beta)}$ and $u_2(t) = e^{j(\alpha-\beta)}$. The definition $\cos \beta = r/2$ is used to find angle $\beta$ and then $e^{j\alpha}$ is transformed d into $e^{j(\alpha+\beta)}$ by rotating a positive angle $\beta$. Similarly, we get $e^{j(\alpha-\beta)}$ from $e^{j\alpha}$ by rotating by the negative angle $\beta$. The following relations can be used to represent the above complex exponential by its coordinates:

$\cos \alpha = x/r$,
$\sin \alpha = y/r$,
$\cos \beta = r/2$, and
$\sin \beta = \sqrt{1 - r^2/4}$.

Substituting the cosine and sine values generates the expression:

$$e^{j(\alpha \pm \beta)} = (\cos\alpha + j\sin\alpha)(\cos\beta \pm j\sin\beta)$$

$$= (x + jy)\left(1 \pm j\sqrt{\frac{1}{x^2 + y^2} - 4}\right)$$

In various embodiments, different implementations can be used to form the decomposed signals, including CORDIC rotations and/or Look Up Tables (LUTs) that are used to form the arccosine functions.

Referring back to FIG. 3, the separator 305 digitally forms the constant envelope phase modulated signals and processes the sampled signals via digital signal processing hardware at a sample rate $R_s$. The sample rate is chosen to provide adequate bandwidth in the digital domain to represent the signal sufficiently well such that the two (or more) signals, when reconstructed, represent an amplified version of the input signal a(t). The separator 305 can also generate control signals $c_{1-n}(t)$ that can be used to set parameters such as the maximum gain, maximum power, or voltage depending on the class of amplifier used. In the illustrated embodiment, the control signals are provided to control circuitry 310.

After the digital constant envelope signals $u_{1-2}(t)$ are formed, the signals are converted from digital to analog in the radio via digital-to-analog (D/A) converters and then the signals are up-converted to radio frequencies (RF) by two or more radios 315. In the illustrated embodiment, one radio is deployed in the signal path of each of the decomposed signals. In various alternative embodiments, the radios 315 can be direct conversion or heterodyne type radios 315 or any other available type of radio. The signals at the output terminals of the radios 315 are then sent on to corresponding non-linear power amplifiers 320, which may be any type of amplifier running in a non-linear mode of operation. In one embodiment, Class E amplifiers are used because they are thought to provide the highest theoretical and practical efficiency. The output signals of the amplifiers 315 are combined in a combiner 325, such as a Chiriex lossless combiner in the outphase modulation approach, and the output signal of the combiner 325 is then attached to the load.

The output of the combiner 325 is also sampled by an RF coupler 330, and the signal from the coupler 330 is brought to an observation receiver 335 that forms a digital representation of the signal at the output terminal of the combiner 325. The observation receiver 335 supplies a calibration unit (not shown in FIG. 3) in the separator 305 with data that is compared to the transmitted source data. Calibration and compensation data is computed using the source signal and the sampled output signal. The plurality of radio paths, amplifiers 320, and combiner 325 are integrated with several digital control loops (which may be digitally implemented in the separator 305) that provide calibration and compensation for the constant-envelope signals, amplify the constant-envelope signals, and recombine the constant-envelope signals. The calibration and/or compensation may be determined such that the transmitter output meets linearity, spurious emissions, and efficiency requirements, as will be discussed herein. For example, the calibration loops can perform calibration and compensation for effects including group delay, gain, phase, flatness, non-linear phase and gain distortion, and the like. The calibration and compensation is applicable over wideband signals to allow for wideband signals and wider TX filters.

Figure 5:
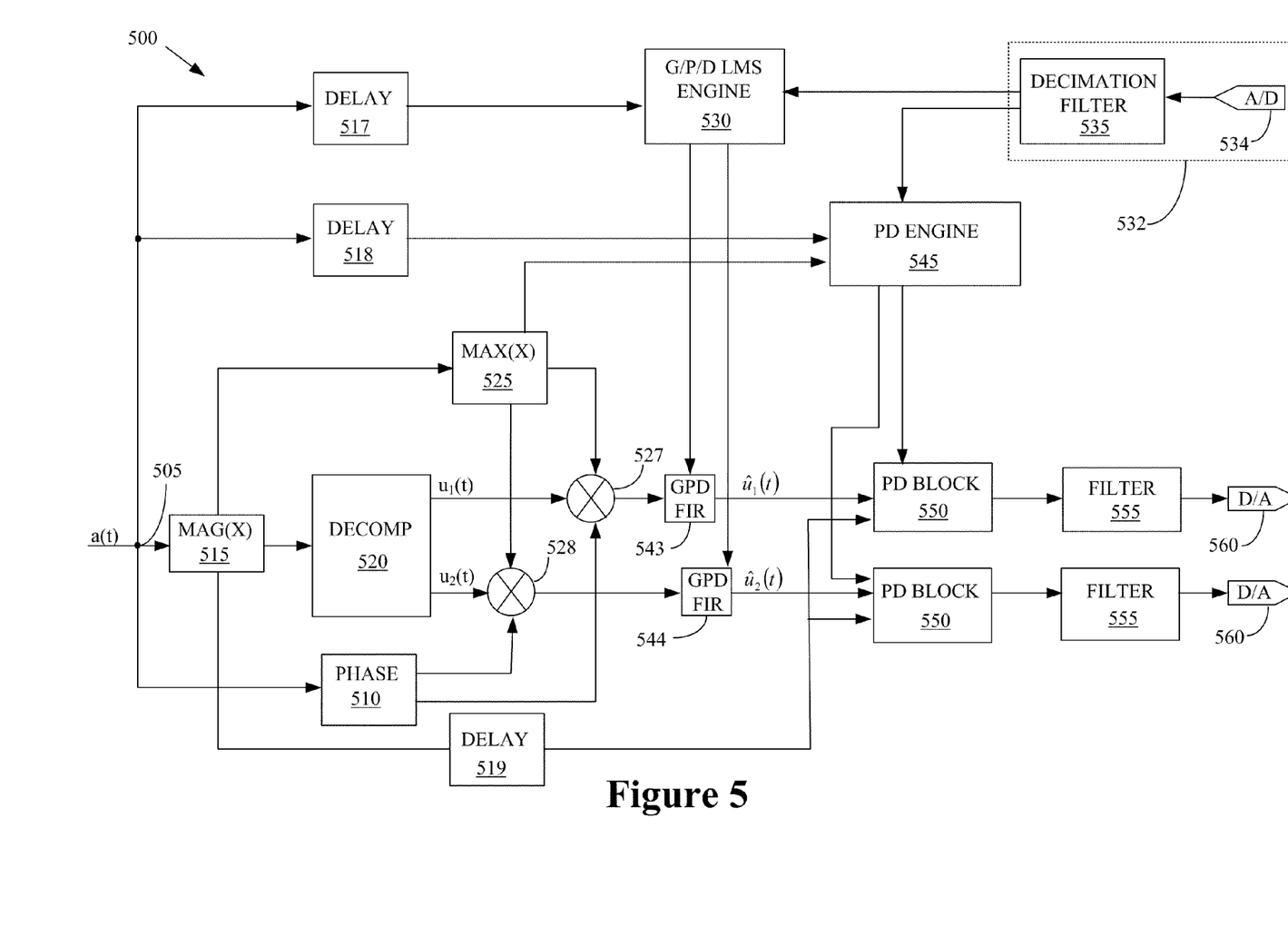
FIG. 5 conceptually illustrates one exemplary embodiment of a LINC separator that digitally implements calibration and compensation using analog feedback.

FIG. 5 conceptually illustrates one exemplary embodiment of a LINC separator 500 that digitally implements calibration and compensation using analog feedback. Connections between the signal paths depicted in FIG. 5 are indicated by solid black circles. Otherwise, signal paths that cross in FIG. 5 are not interconnected. In the illustrated embodiment, the separator 500 is used as part of a LINC amplifier (such as the amplifier 500 depicted in FIG. 5) and the analog feedback is provided by a radiofrequency coupler at the output of the LINC amplifier. The separator 500 is configured to receive a bounded-amplitude and phase-modulated input signal at input node 505. The input signal, a(t), can then be provided to other elements in the separator 500 including a phase estimator 510 that is configured to determine the phase of the input signal, a signal magnitude determination unit 515 that is configured to generate a signal that represents the amplitude of the input signal, |a(t)|, and delay elements 517, 518, 519 that are used to controllably delay the input signal by a specified time (or other measure of the delay such as a number of chips).

The output signal of the magnitude determination unit 515 can then be provided to a decomposition element 520, which decomposes the input signal into a plurality of signals, $u_{1,2}(t)$. In the illustrated embodiment, the decomposition element 520 decomposes the input signal into a pair of signals, $u_{1,2}(t)$, which are then processed using parallel signal paths in the separator 500. For example, the decomposition element 520 may implement a 64K×16 lookup table for generating digital representations of the I-component and Q-component of the input signal, e.g., by implementing the equations discussed herein with respect to FIG. 3. Although two signal paths are depicted leaving from the decomposition element 520 in FIG. 5, persons of ordinary skill in the art having benefit of the present disclosure should appreciate that this embodiment is illustrative and is not intended to limit the number of constant envelope signals that can be generated by alternative embodiments of the separator 500. In alternative embodiments, the decomposition element 520 can decompose the input signal into a number of signals that can be processed using a corresponding number of parallel signal paths.

The output of the magnitude determination unit 515 is also provided to a maximum magnitude determination unit 525. In the illustrated embodiment, the maximum magnitude determination unit 525 determines the maximum magnitude of the input signal and/or an EER maximum voltage associated with the input signal. The maximum magnitude determination unit 525 (and other elements in the separator 500) may also be controlled by a manual register overwrite. In the interest of clarity, the various manual register overwrites are not shown in FIG. 5. In the illustrated embodiment, an output signal from the maximum magnitude determination unit 525 is provided to the multiplier units 527, 528. The phase detection element 510 also provides the phase of the input signal to the multiplier units 527, 528. The maximum magnitude and a phase of the input signal can then be used to generate a pair of constant envelope signals from the I-component and Q-component of the input signal, a(t). For example, the multiplier units 527, 528 can use the phase and maximum magnitude information to transform the output of the decomposition unit 520 into the constant envelope phase modulated signals $u_1(t) = e^{j(\alpha+\beta)}$ and $u_2(t) = e^{j(\alpha-\beta)}$ discussed herein.

Propagation along the parallel signal paths, processing by the elements on the signal paths, filtering and/or conversion of the digital signal to an analog signal, amplification, and other effects can lead to gain, phase, and/or delay imbalances between the constant envelope signals. Compensation, calibration, and pre-distortion may therefore be applied to the different branches of the signal path in the separator 500. The amount of compensation, calibration, and/or pre-distortion is determined based upon feedback received from the output signal of the transmitter. Ideally, the output signal of the transmitter is an exact amplified copy of the input signal. A comparison of the fed back portion of the output signal and an appropriately delayed portion of the input signal can therefore be used to estimate and compute the appropriate compensation, calibration, and/or pre-distortion based on a measure of the difference between the input and output signals. In one embodiment, the difference measurement is provided by an error vector magnitude, which is a waveform quality metric that measures the difference between the output signal of the combiner and the input signal.

Figure 6:
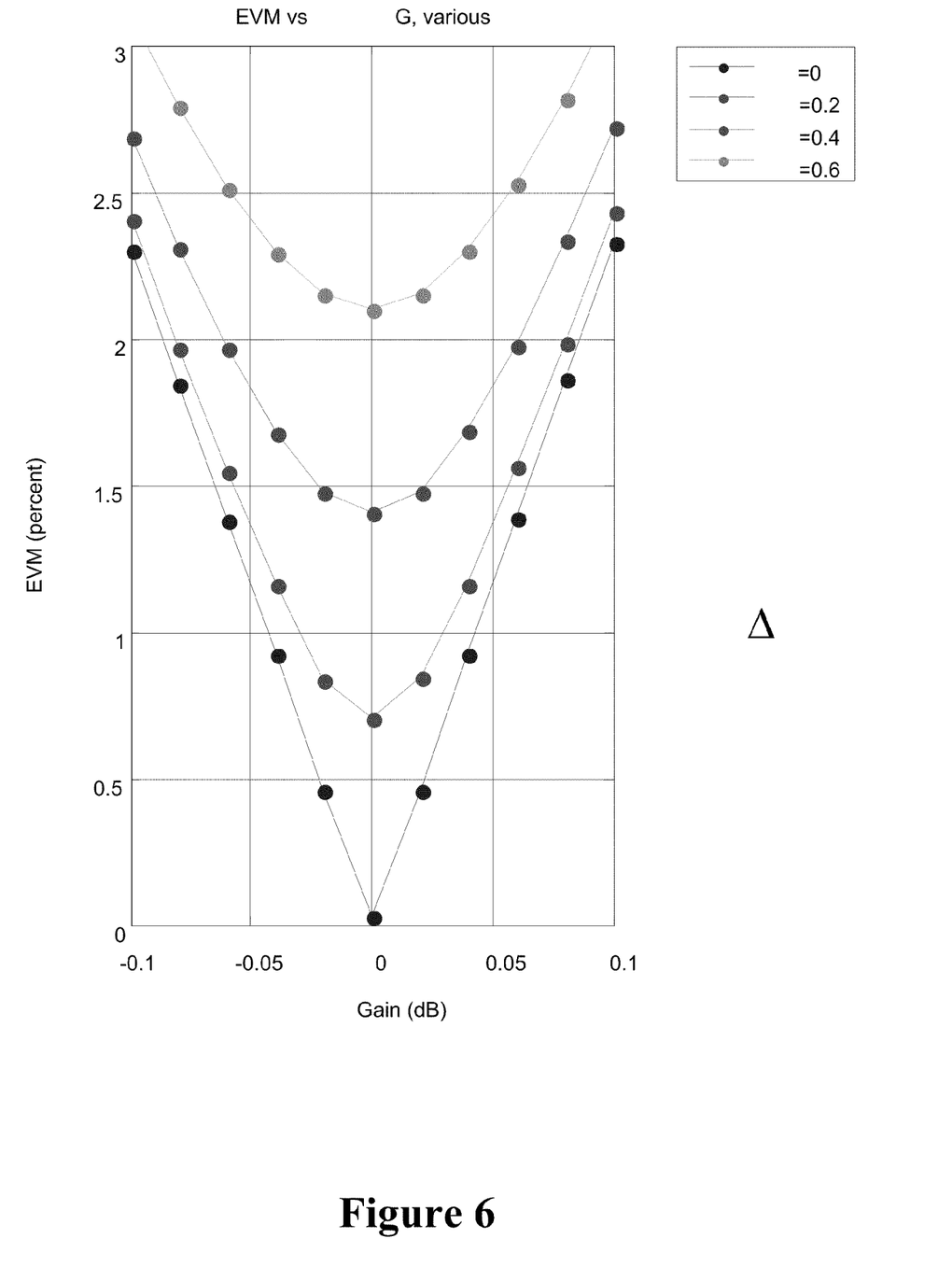
FIGS. 6 and 7 show simulation results that illustrate the dependence of the error vector magnitude (EVM) on phase and gain differences in the two paths of a LINC amplifier.
Figure 7:
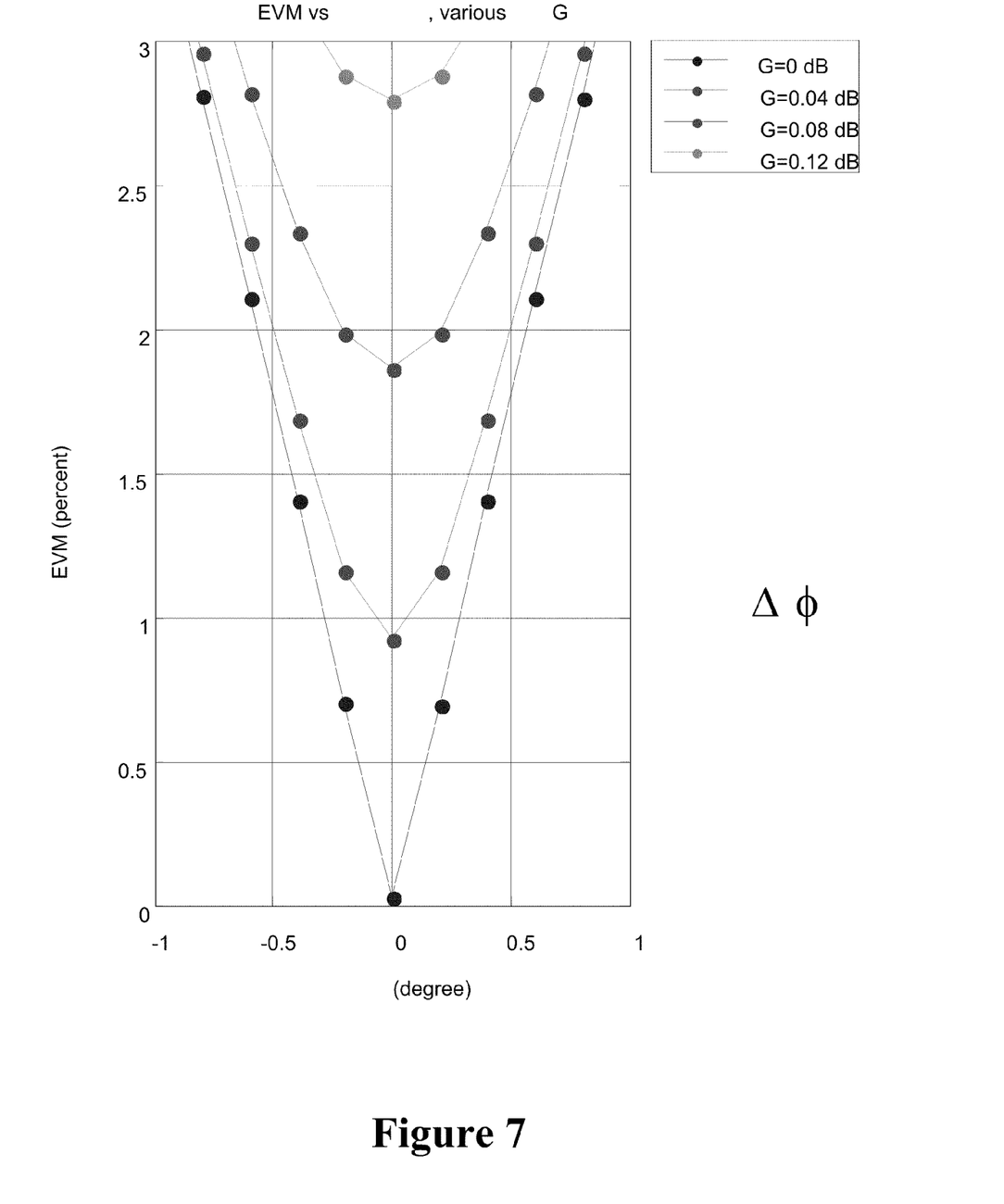

FIG. 6 shows simulation results that illustrate the dependence of the error vector magnitude (EVM) on phase and gain differences in the two paths of a LINC amplifier. The vertical axis is the error vector magnitude measured as a percentage and the horizontal axis is the gain imbalance in decibels between the two paths of the amplifier. Each curve represents a different phase imbalance between the two paths of the amplifier. FIG. 7 shows simulation results that also illustrate the dependence of the error vector magnitude (EVM) on phase and gain differences in the two paths of a LINC amplifier. In FIG. 7, however, the vertical axis is the error vector magnitude measured as a percentage and the horizontal axis is the phase imbalance in degrees between the two paths of the amplifier. Each curve represents a different gain imbalance between the two paths of the amplifier. FIGS. 6 and 7 demonstrate the sensitivity of the error vector magnitude to both the gain imbalance and the phase imbalance. For example, a 1% change in the error vector magnitude can lead to a 40 dB noise rise. The error vector magnitude has a minimum value at zero gain imbalance and zero phase imbalance between the two paths of the amplifier. In some embodiments, this minimum value is a global minimum for the system.

Referring back to FIG. 5, a portion of the input signal provided at the node 505 is delayed by the delay 517 and then provided to a gain/phase/delay engine 530 that calculates calibrations and/or compensations to the gain, phase, and/or delay of the signals. The amount of delay provided by the delay 517 is determined so that the calibrations and/or compensations provided by the engine 530 is applied to the portion of the signal that was used to generate the calibrations and/or compensations. Thus, the delay 517 is determined based upon delays that may occur in the magnitude element 515, the decomposition element 520, the maximum magnitude determination unit 525, the phase determination element 510, the multipliers 527, 528, and/or any other elements in the signal paths that may not be shown in FIG. 5.

The output signal of the combiner 325 is provided to the engine 530 as feedback via an observation receiver 532. In the illustrated embodiment, the observation receiver 532 includes a radio down conversion filter such as an analog-to-digital converter 534 and a decimation filter 535, which are used to convert the analog feedback signal into a digital format. For example, the A/D converter 534 may create the digital signal by sampling an analog signal at a rate $R_S$. The sampled signal may then be provided to the decimation filter 535, which may reduce the sampling rate of the sampled signal by a factor of $N_2$ so that the output signal of the observation receiver 532 has a sampling rate of $R_S/N_2$, which is equal to the digital sampling rate of the input signal a(t).

The gain/phase/delay engine 530 provides linear gain, phase, and delay compensation to account for differences in line length, cabling, insertion loss/gain of the amplifier network, the combiner 325, and the like. In the illustrated embodiment, the gain/phase and delay engine 530 implements a control algorithm that minimizes a waveform quality metric, such as the Error Vector Magnitude (EVM), between the digital representation of the output signal of the combiner provided by the observation receiver 532 and the (delayed) digital input signal received at the node 505. Any of a variety of minimization algorithms can be used to compute the EVM and the minimization of EVM can be accomplished by varying gain/phase and delay via a gradient adaptive algorithm such as least mean square (LMS) or least squares. As illustrated in FIGS. 6 and 7, the EVM is a sensitive measure of gain and/or phase imbalances in the system and is therefore an effective variable for controlling the gain/phase/delay engine 530. Moreover, in some embodiments the EVM has a global minimum at zero gain imbalance and zero phase imbalance so that local minima at other offsets do not interfere with operation of the control algorithm.

The engine 530 computes the necessary linear compensation and provides this information to digital compensation filters 543 and 544. In the illustrated embodiment, the filters 543 and 544 are multiple tap digital finite impulse response filters (FIR filters). The digital finite impulse response filters 543 and 544 use the filter coefficients computed by engine 530. For example, each filter 543, 544 may be comprised of multiple complex coefficients that each represents a filter tap. The preferred number of taps in the filters 543, 544 may be dependent on the flatness of the system, but the actual number of taps implemented in a specific embodiment is a matter of design choice. In the illustrated embodiment, the compensation filters 543, 544 can be configured so that they have unequal gains. Selectively setting the gains of each of the compensation filters 543, 544 using the signals provided by the engine 530 can therefore modify the differential gain of the signals to compensate for relative imbalances in the gain along the two signal paths. In the illustrated embodiment, the output signals, $\hat{u}_{1,2}(t)$, of the compensation filters 543, 544 are substantially equal gain, phase and time aligned compensated signals and thus the signals, $\hat{u}_{1,2}(t)$, are substantially aligned.

Another portion of the input signal provided at the node 505 is delayed by the delay 518 and then provided to a pre-distortion (PD) engine 545. In the illustrated embodiment, the pre-distortion engine 545 is a phase pre-distortion engine 545. However, in alternative embodiments, the pre-distortion engine 545 may apply signal pre-distortion, path pre-distortion, gain/phase pre-distortion, and the like. The amount of delay provided by the delay 518 is determined so that the phase pre-distortion provided by the engine 545 is applied to the appropriate portion of the signal. Thus, the delay 518 is determined based upon delays that may occur in the magnitude element 515, the decomposition element 520, the maximum magnitude determination unit 525, the phase determination element 510, the multiplier is 527, 528, and/or any other elements in the signal paths that may not be shown in FIG. 5. In some embodiments, the non-linear pre-distortion applied to the signal is a function of the amplitude envelope of the input signal a(t) and so a signal that indicates the maximum value of the amplitude is generated by the maximum magnitude determination unit 525 and provided to the pre-distortion engine 545. Feedback from a combiner (such as the combiner 325) is also provided to the pre-distortion engine 545 via the observation receiver 532, as discussed herein.

The pre-distortion engine 545 provides control signals to pre-distortion blocks 550 that apply the pre-distortion determined by the pre-distortion engine 545. In various alternative embodiments, the control signals may be representative of the phase angles discussed above, values of coefficients of the functions that describe the mathematical function required for compensation, values of entries in a look-up table that describe the mathematical function required for compensation, and the like. For example, the control signal may represent coefficients ($\alpha_{k_q}$) to the functions that describe the phase angles. The pre-distortion blocks 550 also receive signals representative of the magnitude of the input signal |a(t)| from the magnitude determination unit 515. Each path in the TX chain has a pre-distortion block 550 present to modulate the phase of each path as a function of the final envelope, i.e., the blocks 550 provide nonlinear phase pre-distortions that are applied using the various signals provided to the blocks 550. In various alternative embodiments, the blocks 550 correct the effects of non-linear phase leading/lagging introduced by the combiner and/or any other elements in the system. Additionally, the phase compensation can be used to correct phase impairments introduced by final filtering. Filtering, or sampling at rate $R_1$, reduces the available bandwidth, thereby impressing a small degree of amplitude modulation on the desired constant envelope signals. The amplitude modulation appears as a phase modulation at the amplifier device because the device turn-on time shifts as a function of the amplitude. This shift in the turn-on time appears as a phase modulation that can be substantially compensated by the pre-distortion engine 545 and the pre-distortion blocks 550, which can be configured to account for the effects of the combiner, the bandwidth limitations, and the composite phase impairments as a function of envelope.

Spurious emissions and EVM at the output of the combiner can be used to determine the correction function coefficients in the pre-distortion engine 545. For example, the pre-distortion applied to the gain/phase/delay-corrected signals on each path can be calculated by minimizing the EVM that is computed using the path signals and the feedback provided via the observation receiver 532. However, persons of ordinary skill in the art having benefit of the present disclosure should appreciate that other techniques for determining the pre-distortion based upon the path signals and the feedback signal may also be used.

Following the gain/phase/delay correction and the pre-distortion, the signals on each path can be filtered using filters 555 to provide a digital signal to the digital-to-analog (D/A) converters 560. In the illustrated embodiment, the digital signals provided by the pre-distortion blocks 550 have a sampling rate of R. The filters 555 may then use interpolation to increase the sampling rate by a factor of $N_1$ so that the rate of the signal provided to the D/A converters 560 is $R \times N_1$. Final filtering by the filters 555 limits the bandwidth of the signal present at the amplifier device (not shown in FIG. 5). If the amplifier is a switched class amplifier that expects a constant envelope signal, filtering by the filters 555 can introduce amplitude modulation. The trade off between filtering, bandwidth, and phase pre-distortion complexity may be adjusted to minimize bandwidth, while maintaining the required EVM and spurious emissions. The D/A converters 560 then provide an analog representation of the signal to the radios (and the combiner) for transmission over the air interface.

Figure 8:
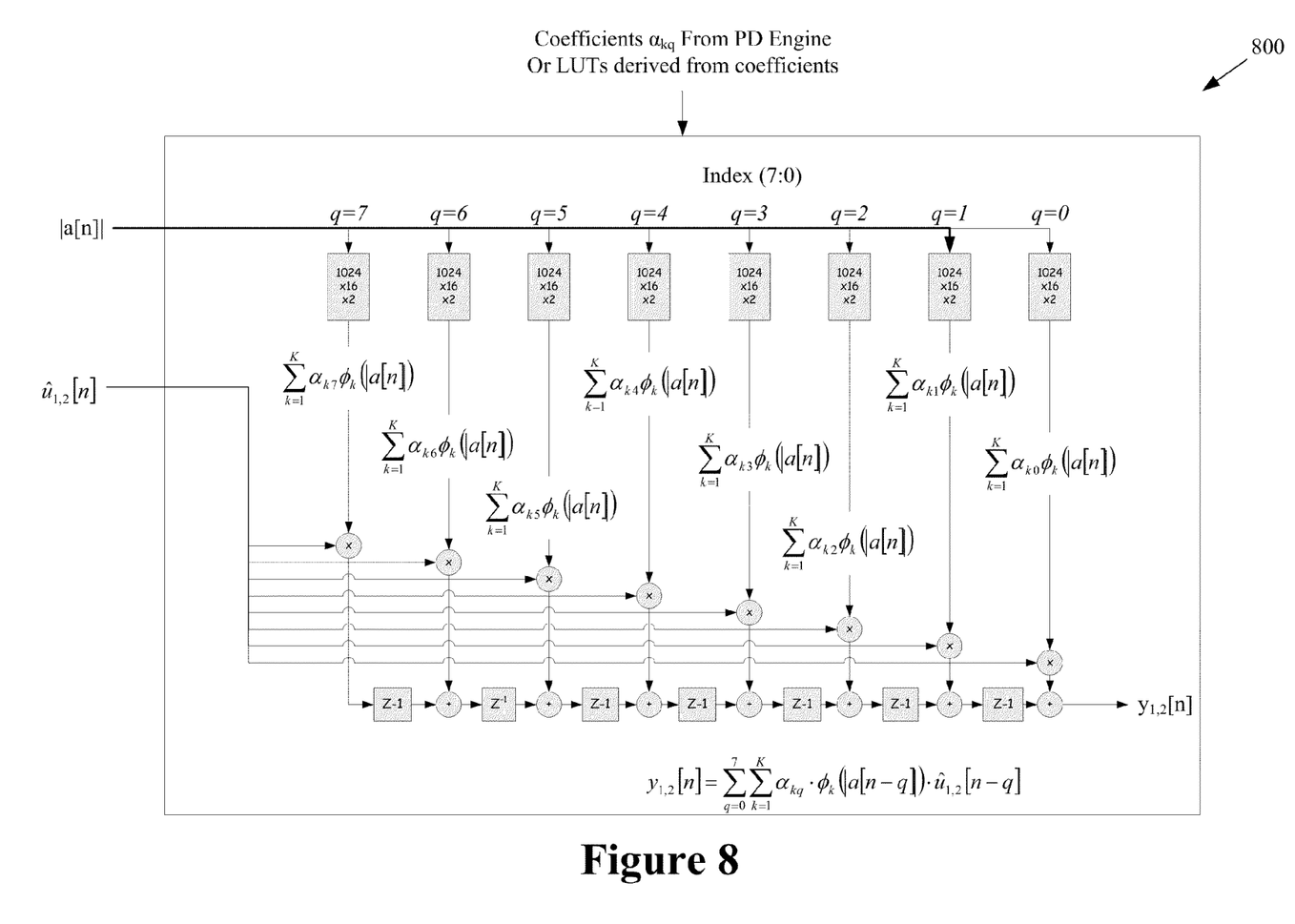
FIG. 8 conceptually illustrates one exemplary embodiment of a pre-distortion block.

FIG. 8 conceptually illustrates one exemplary embodiment of a phase pre-distortion engine 800, such as the phase pre-distortion engine 545 shown in FIG. 5. In the illustrated embodiment, the non-linear phase pre-distortion engine 800 provides digital phase (and gain if required) compensation to two constant envelope signals. The pre-distortion function provides compensation for non-linearities that occur in the transmission path, including the amplifiers and combiners. Reactive combiners can contribute significant non-linear phase distortion to the combined sum of the two constant envelope signals. The general form of the pre-distortion function is given by $$y_{1,2}[n] = \sum_{q=0}^{7} \sum_{k=1}^{K} \alpha_{kq} \phi_k(|a[n-q]|) \hat{u}_{1,2}[n-q] \quad (1)$$

where q indicates the number of memory terms, k is an order of basis function $\phi_k$, $\alpha_{kq}$ are coefficients of the functions k at time delay q, and n is the data sample index, $\hat{u}_{1,2}$ are the signals present at the input of the pre-distortion engine 800. The magnitude of the envelope a[n] is used as the input argument (or index in a digital implementation) to the compensation function. This implies that the correction function is compensating envelope induced path non-linearity.

In various alternative embodiments, the functions $\phi_k(|a[n-q]|)$ may be any of the various functions that have been commonly used for non-linear system identification and digital pre-distortion. Common functions include:

Conventional polynomials:

$$y[n] = \sum_{q=0}^{Q} \sum_{k=1}^{K} \alpha_{kq} |x[n-q]|^{k-1} \hat{u}[n-q], \text{ or}$$

$$y[n] = \sum_{q=0}^{Q} \sum_{k=1}^{K} \alpha_{kq} \phi_k(|a[n-q]|) \hat{u}[n-q]$$

where $\phi_k(x) = |x|^{k-1}$.

Shifted Legendre polynomials:

$$y[n] = \sum_{q=0}^{Q} \sum_{k=1}^{K} \alpha_{kq} \psi_k(x[n-q]) \hat{u}[n-q], \text{ where}$$

$$\psi_k(x) = \sum_{i=1}^{k} (-1)^{i+k} \frac{(k+l)!}{(l-1)!(l+1)!(k-l)!} |x|^{l-1}$$

Alternatively, Hermite polynomials, piecewise Hermite, or other functions including Forsythe synthesized orthogonal functions may also be used in this manner. Depending on the nature of the non-linearity, certain functional sets may provide better correlation matrix performance, and a better fit to the system non-linearity. The pre-distortion engine 545 computes the coefficients, $\alpha_{kq}$, and the pre-distortion function 800 uses the coefficients (or Look Up Tables derived from the coefficients) to apply the required non-linear compensation. The coefficients $\alpha_{kq}$ and set of functions ($\phi_k$, $\psi_k$) describe the overall function used to compensate for the non-linearity introduced by the amplifiers and combiner. The embodiment shown in FIG. 8 uses Look Up Tables (LUT) as a method of applying the pre-distortion function to the signals. Other embodiments may apply coefficients directly to the path or alternatively may apply a combination of coefficients and LUTs.

Figure 9:
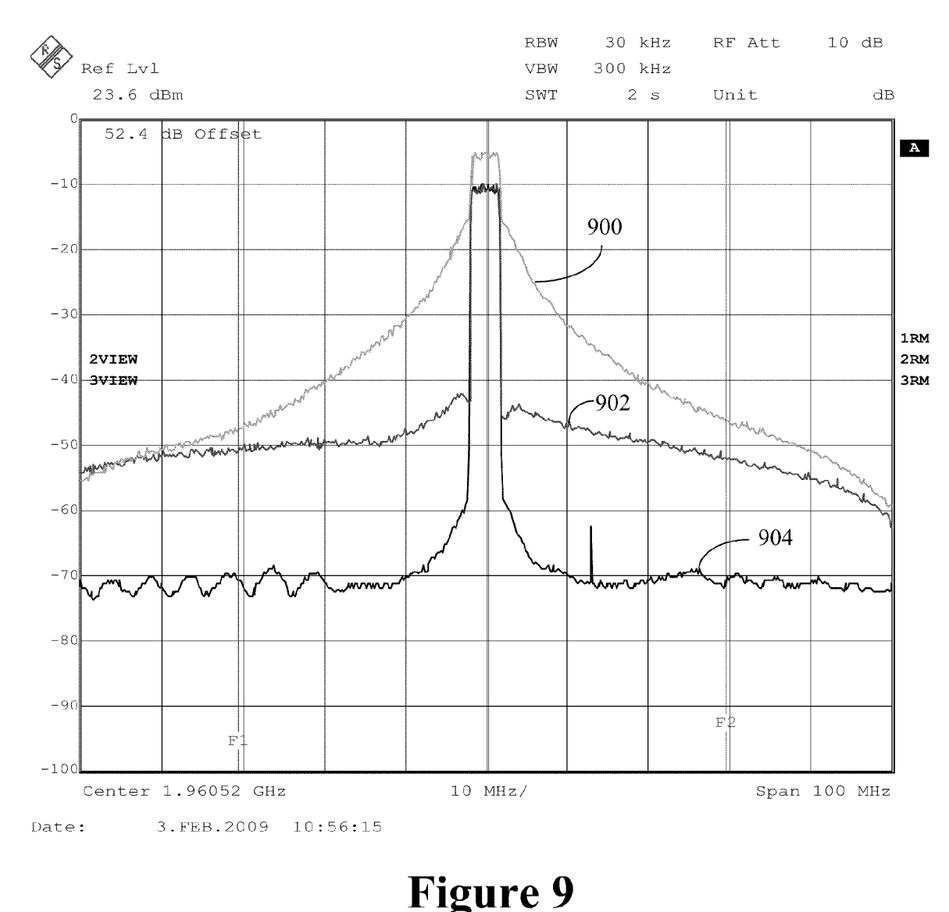
FIG. 9 shows results of simulation of noise in the output signal for an amplifier such as the LINC amplifier shown in FIG. 3.

FIG. 9 shows results of the simulation of noise in the output signal for an amplifier such as the LINC amplifier 300 shown in FIG. 3. The vertical axis indicates the signal and/or noise level in decibels and the horizontal axis indicates frequency in megahertz. The signal is centered at approximately 1.96 GHz and has a 10 MHz bandwidth. The entire span of the horizontal axis is approximately 100 MHz. The upper curve 900 in FIG. 9 shows the output signal for a LINC amplifier when no calibration or compensation is provided. The middle curve 902 in FIG. 9 shows the output signal for the LINC amplifier following simple manual gain and phase calibration. The lower curve 904 in FIG. 9 shows the output signal for the LINC amplifier after applying the digital calibration, compensation, and pre-distortion techniques described herein. The digital techniques described herein result in a significantly better suppression of out-of-band noise. For example, near the central bandwidth, the out-of-band noise is suppressed by 50 or more decibels (relative to the uncorrected output signal) by the digital techniques described herein.

Embodiments of the digital calibration, compensation, and filtering techniques described herein may have a number of advantages over the conventional practice. For example, the efficiency can be dramatically increased for the least efficient component of a wireless transmitter, namely the amplification of the RF path. Increasing the RF path amplification efficiency decreases overall power consumption at several levels, including the transmitter, and ancillary service equipment such as battery backup, air conditioning, power conditioning. The operator of the higher efficiency transmitter benefits from a reduction in operational expense (OPEX), increased capacity and density, and improved reliability. The operator's capital expenditures (CAPEX) also decrease given the size reduction, weight reduction, material cost reduction, improved manufacturability, and improved reliability that come with increased efficiency.

Portions of the disclosed subject matter and corresponding detailed description are presented in terms of software, or algorithms and symbolic representations of operations on data bits within a computer memory. These descriptions and representations are the ones by which those of ordinary skill in the art effectively convey the substance of their work to others of ordinary skill in the art. An algorithm, as the term is used here, and as it is used generally, is conceived to be a self-consistent sequence of steps leading to a desired result. The steps are those requiring physical manipulations of physical quantities. Usually, though not necessarily, these quantities take the form of optical, electrical, or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise, or as is apparent from the discussion, terms such as "processing" or "computing" or "calculating" or "determining" or "displaying" or the like, refer to the action and processes of a computer system, or similar electronic computing device, that manipulates and transforms data represented as physical, electronic quantities within the computer system's registers and memories into other data similarly represented as physical quantities within the computer system memories or registers or other such information storage, transmission or display devices.

Note also that the software implemented aspects of the disclosed subject matter are typically encoded on some form of program storage medium or implemented over some type of transmission medium. The program storage medium may be magnetic (e.g., a floppy disk or a hard drive) or optical (e.g., a compact disk read only memory, or "CD ROM"), and may be read only or random access. Similarly, the transmission medium may be twisted wire pairs, coaxial cable, optical fiber, or some other suitable transmission medium known to the art. The disclosed subject matter is not limited by these aspects of any given implementation.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope of the disclosed subject matter. Accordingly, the protection sought herein is as set forth in the claims below.

What is claimed:

1. An amplifier, comprising:
    a signal separator for decomposing an input signal into at least two constant envelope signals;
    at least two amplifier circuits for amplifying the constant envelope signals;
    a combiner for combining the amplified constant envelope signals to form an output signal that is an amplified representation of the input signal;
    at least two linear correction circuits, wherein each linear correction circuit is configured to apply at least one of a gain, phase, or delay correction to a corresponding one of the constant envelope signals based upon a feedback portion of the output signal, said corrections being applied prior to amplifying the constant envelope signals; and
    at least two pre-distortion circuits, wherein each pre-distortion circuit is configured to apply a non-linear pre-distortion to a corresponding one of the constant envelope signals based upon the feedback portion of the output signal, said corrections being applied prior to amplifying the constant envelope signals, wherein each linear correction circuit is configured to apply said at least one gain, phase, or delay correction that is selected to minimize an error vector magnitude that is a waveform quality metric that measures a difference between the output signal of the combiner and the input signal, and wherein each pre-distortion circuit is configured to apply a non-linear pre-distortion that is selected to minimize the error vector magnitude, and wherein each pre-distortion circuit is configured to apply the non-linear pre-distortion to correct non-linear phase leading/lagging introduced by the combiner or other elements in the amplifier, and wherein the amplifier comprises at least two filters to filter the constant envelope signals following pre-distortion, and wherein each pre-distortion circuit is configured to apply the nonlinear pre-distortion to correct phase impairments introduced by said at least two filters.

2. The amplifier of claim 1, wherein each pre-distortion circuit is a phase pre-distortion circuit.

3. The amplifier of claim 1, wherein the signal separator is configured to implement at least one of a CORDIC rotation or a Look Up Table (LUTs) to form arccosine functions representative of said at least two constant envelope signals.

4. The amplifier of claim 1, wherein the signal separator is configured to generate control signals for setting parameters for at least one of a maximum gain, a maximum power, or a voltage, and wherein the parameters are determined based upon a class of said at least two amplifier circuits.

5. The amplifier of claim 1, wherein the combiner is a Chiriex lossless combiner.

6. The amplifier of claim 1, wherein each linear correction circuit is configured to apply said at least one gain, phase, or delay correction that is determined such that the output signal meets at least one of a linearity, a spurious emission, or an efficiency requirement.

7. A method, comprising:
    decomposing an input signal into at least two constant envelope signals;
    applying at least one of a linear gain, phase, or delay correction to each of the constant envelope signals based on a feedback signal;
    applying a non-linear pre-distortion to each of the constant envelope signals based upon the feedback signal;
    amplifying the constant envelope signals after applying said linear corrections and said non-linear pre-distortion to the constant envelope signals; and
    combining the amplified constant envelope signals to form an output signal, wherein a portion of the output signal is used to generate the feedback signal, wherein applying said at least one gain, phase, or delay correction comprises determining said at least one gain, phase, or delay correction such that the output signal meets at least one of a linearity, a spurious emission, or an efficiency requirement, and wherein applying the non-linear pre-distortion comprises determining the nonlinear pre-distortion to minimize the error vector magnitude, and wherein applying the non-linear pre-distortion comprises determining the nonlinear pre-distortion to correct non-linear phase leading/lagging, and further comprising filtering the amplified constant envelope signals following pre-distortion and prior to combining the amplified constant envelope signals, and wherein applying the nonlinear pre-distortion comprises applying the nonlinear pre-distortion to correct phase impairments introduced by filtering the amplified constant envelope signals.

8. The amplifier of claim 7, wherein applying the nonlinear pre-distortion comprises applying a non-linear phase pre-distortion.

9. The method of claim 7, wherein decomposing the input signal comprises forming arccosine functions representative of said at least two constant envelope signals using at least one of a CORDIC rotation or a Look Up Table (LUT).

10. The method of claim 7, comprising generating control signals for setting parameters for at least one of a maximum gain, a maximum power, or a voltage, and wherein the parameters are determined based upon a class of at least two amplifier circuits used to amplify the constant envelope signals.

11. The method of claim 7, wherein combining the amplified constant envelope signals comprises combining the amplified constant envelope signals using a lossless combiner.

12. The method of claim 7, wherein applying said at least one gain, phase, or delay correction comprises determining said at least one gain, phase, or delay correction such that the output signal meets at least one of a linearity, a spurious emission, or an efficiency requirement.

* * * * *